(12) United States Patent
Yao et al.

(10) Patent No.: US 10,593,845 B2
(45) Date of Patent: Mar. 17, 2020

(54) LIGHT EMITTING DEVICE INCLUDING LIGHT EMITTING UNIT ARRANGED IN A TUBE

(71) Applicant: EPISTAR CORPORATION, Hsinchu (TW)

(72) Inventors: Chiu-Lin Yao, Hsinchu (TW);
Shuo-Chieh Kan, Hsinchu (TW);
Chun-Wei Lin, Hsinchu (TW);
Been-Yu Liaw, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/213,743

(22) Filed: Dec. 7, 2018

(65) Prior Publication Data

US 2019/0181313 A1    Jun. 13, 2019

Related U.S. Application Data

(63) Continuation of application No. 15/217,202, filed on Jul. 22, 2016, now Pat. No. 10,158,055.

(30) Foreign Application Priority Data

Jul. 23, 2015  (TW) .............................. 104123920 A

(51) Int. Cl.
*H01L 33/00*      (2010.01)
*H01L 33/60*      (2010.01)
(Continued)

(52) U.S. Cl.
CPC .............. *H01L 33/60* (2013.01); *F21K 9/232* (2016.08); *F21K 9/90* (2013.01); *H01L 33/54* (2013.01);
(Continued)

(58) Field of Classification Search
CPC ..... H01L 33/60; H01L 33/54; H01L 2224/18; H01L 25/0753; H01L 2933/005;
(Continued)

(56) References Cited

U.S. PATENT DOCUMENTS 8,052,303 B2   11/2011  Lo et al.
8,979,307 B2 *  3/2015  Ishibashi ................ H05K 1/189
                                              362/249.02
(Continued)

FOREIGN PATENT DOCUMENTS

CN         204062586 U    12/2014

OTHER PUBLICATIONS

Kohei et al., Anomalous Light Transmission from Plasmonic-capped Nanoapertures, Nano Lett, 2011, 11, 960-965.
(Continued)

*Primary Examiner* — Ismail A Muse
(74) *Attorney, Agent, or Firm* — Ditthavong & Steiner P.C.

(57) ABSTRACT

A light-emitting device includes a carrier with a first surface and a second surface opposite to the first surface; and a light-emitting unit disposed on the first surface and configured to emit a light toward but not passing through the first surface. When emitting the light, the light-emitting device has a first light intensity above the first surface, and a second light intensity under the second surface, a ratio of the first light intensity to the second light intensity is in a range of 2~9.

15 Claims, 11 Drawing Sheets

(51) Int. Cl.
*H01L 33/54* (2010.01)
*F21K 9/90* (2016.01)
*F21K 9/232* (2016.01)
*H01L 33/50* (2010.01)
*H01L 25/075* (2006.01)
*H01L 33/62* (2010.01)
*F21Y 103/10* (2016.01)
*F21Y 115/10* (2016.01)
*F21Y 107/00* (2016.01)

(52) U.S. Cl.
CPC ....... *F21Y 2103/10* (2016.08); *F21Y 2107/00* (2016.08); *F21Y 2115/10* (2016.08); *H01L 25/0753* (2013.01); *H01L 33/502* (2013.01); *H01L 33/62* (2013.01); *H01L 2224/04105* (2013.01); *H01L 2224/16227* (2013.01); *H01L 2224/18* (2013.01); *H01L 2933/005* (2013.01); *H01L 2933/0091* (2013.01)

(58) Field of Classification Search
CPC .................. H01L 33/62; H01L 33/502; H01L 2933/0091; F21K 9/90; F21K 9/232; F21Y 107/00; F21Y 2115/10; F21Y 2103/10
See application file for complete search history.

(56) References Cited

U.S. PATENT DOCUMENTS

| | | | |
|---|---|---|---|
| 9,437,581 B2* | 9/2016 | Urano | H01L 33/60 |
| 2006/0141365 A1 | 6/2006 | Toyama et al. | |
| 2007/0127235 A1* | 6/2007 | Cooper | A61L 2/26 362/217.1 |
| 2008/0234143 A1 | 9/2008 | Dewinter | |
| 2009/0154156 A1* | 6/2009 | Lo | F21V 5/00 362/234 |
| 2009/0184618 A1 | 7/2009 | Hakata et al. | |
| 2009/0186433 A1 | 7/2009 | Yamaguchi et al. | |
| 2009/0316398 A1 | 12/2009 | Chang | |
| 2010/0252848 A1* | 10/2010 | Liang | B29C 45/14655 257/98 |
| 2010/0253221 A1 | 10/2010 | Chiang | |
| 2011/0096134 A1 | 4/2011 | Kang et al. | |
| 2011/0260646 A1* | 10/2011 | Moon | H01L 25/0753 315/294 |
| 2012/0001203 A1 | 1/2012 | Wang et al. | |
| 2012/0032223 A1 | 2/2012 | Bae et al. | |
| 2012/0049724 A1 | 3/2012 | Nakai | |
| 2012/0217862 A1* | 8/2012 | Matsuda | F21K 9/232 313/46 |
| 2012/0326175 A1* | 12/2012 | Hu | H01L 33/46 257/88 |
| 2012/0326634 A1 | 12/2012 | Li | |
| 2013/0037845 A1* | 2/2013 | Huang | F21K 9/00 257/98 |
| 2013/0058080 A1* | 3/2013 | Ge | F21V 3/00 362/231 |
| 2013/0193453 A1 | 8/2013 | Donofrio et al. | |
| 2013/0279164 A1 | 10/2013 | Hsu | |
| 2014/0103371 A1* | 4/2014 | Moon | H01L 25/0753 257/88 |
| 2014/0167626 A1 | 6/2014 | Kim et al. | |
| 2014/0217437 A1 | 8/2014 | Kim | |
| 2014/0362565 A1 | 12/2014 | Yao et al. | |
| 2014/0362568 A1 | 12/2014 | Su et al. | |
| 2014/0369036 A1 | 12/2014 | Feng | |
| 2015/0003039 A1 | 1/2015 | Liu et al. | |
| 2015/0060911 A1 | 3/2015 | Chien et al. | |
| 2015/0145406 A1 | 5/2015 | Li et al. | |
| 2015/0188006 A1 | 7/2015 | Williams et al. | |
| 2016/0126428 A1 | 5/2016 | Hosokawa et al. | |
| 2016/0260878 A1* | 9/2016 | Takehara | H01L 33/505 |
| 2016/0307879 A1 | 10/2016 | Lien et al. | |
| 2017/0051878 A1 | 2/2017 | Jiang et al. | |
| 2017/0059767 A1 | 3/2017 | Li | |

OTHER PUBLICATIONS

V.S. Smentkowski (ed.), "Surface Analysis and Techniques in Biology", DOI 10.1007/978-3-319-01360-2_9, Springer.

* cited by examiner

LIGHT EMITTING DEVICE INCLUDING LIGHT EMITTING UNIT ARRANGED IN A TUBE

RELATED APPLICATION

This application is a continuation of U.S. application Ser. No. 15/217,202, titled "Light emitting device including light emitting unit arranged in a tube", and filed Jul. 22, 2016, which claims priority to and the benefit of Taiwan Application Serial Number 104123920 filed on Jul. 23, 2015, which is incorporated herein by reference in its entirety.

TECHNICAL FIELD

The present disclosure relates to a light-emitting device, and in particular to a light-emitting device having an optic structure.

DESCRIPTION OF THE RELATED ART

The light-emitting diodes (LEDs) of the solid-state lighting elements have the characteristics of low power consumption, long operational life, small volume, quick response and good opto-electrical property like light emission with a stable wavelength so the conventional lighting fixtures are gradually replaced by the LEDs.

Although the filament made of the light-emitting diodes (LED filament) has been applied to the LED bulbs gradually recently, the fabrication cost and the lighting efficiency of the LED filament still need to be improved. Furthermore, making the light field of the LED filament omni-directional and dealing with the issue of the heat dissipation are still under development.

SUMMARY OF THE DISCLOSURE

A light-emitting device includes a carrier with a first surface and a second surface opposite to the first surface; and a light-emitting unit disposed on the first surface and configured to emit a light toward but not passing through the first surface. When emitting the light, the light-emitting device has a first light intensity above the first surface, and a second light intensity under the second surface, a ratio of the first light intensity to the second light intensity is in a range of 2~9.

The light-emitting device includes an optic structure with a top surface above the first surface and a bottom surface under the second surface, and the optic structure is pervious to the light from the light-emitting unit.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
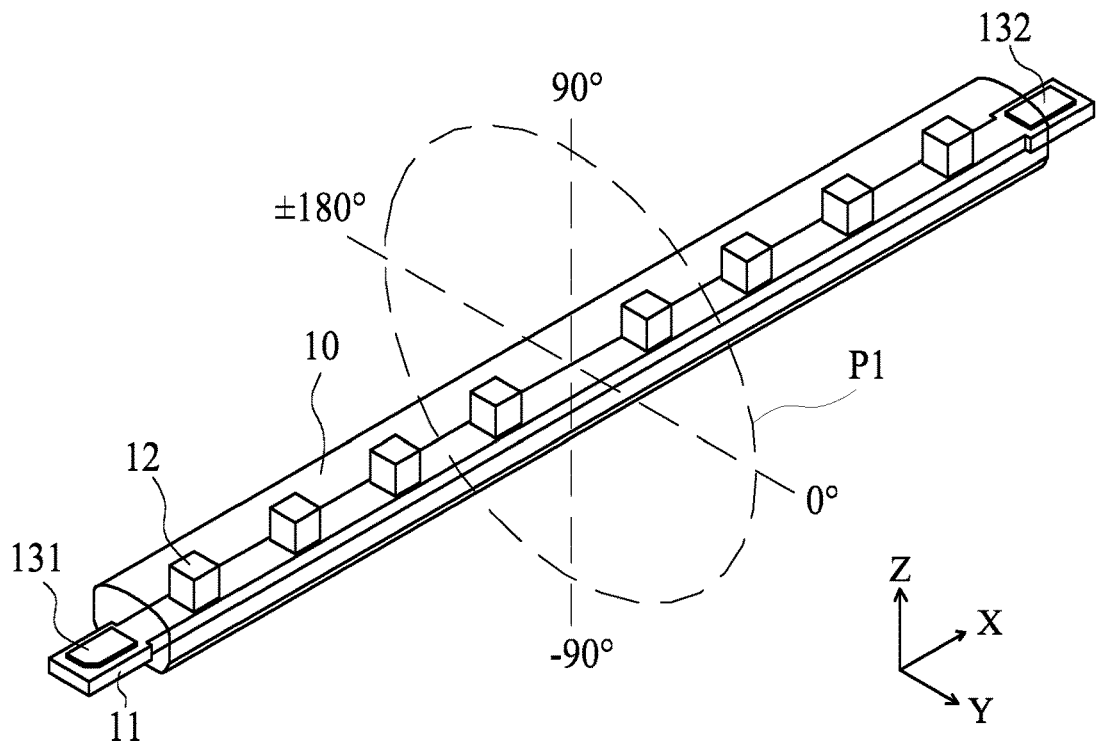
FIG. 1A shows a drawing of a light-emitting device in accordance with an embodiment of the present disclosure.
Figure 1B:
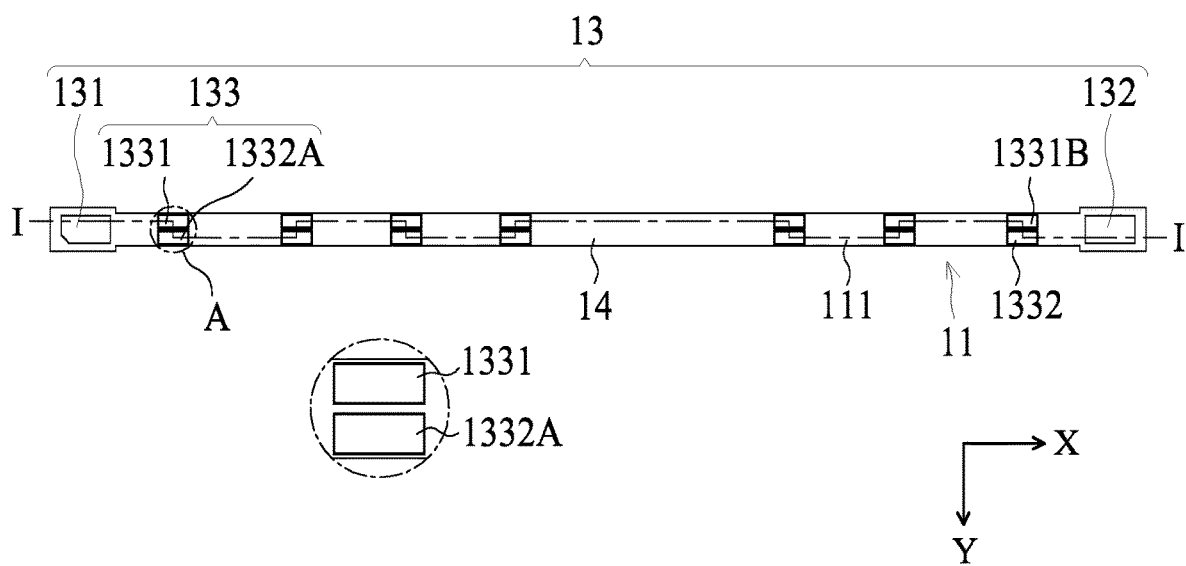
FIG. 1B shows a top view of a carrier of a light-emitting device shown in FIG. 1A.
Figure 1C:
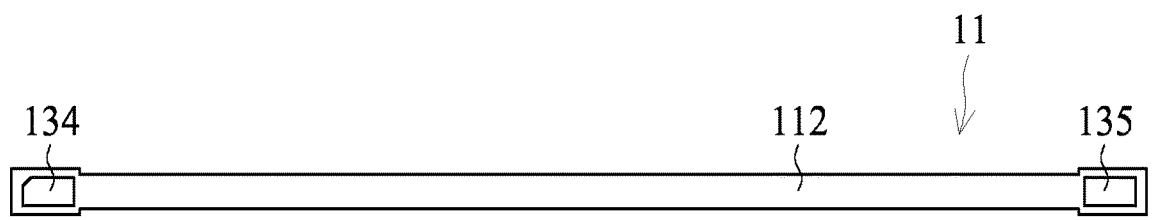
FIG. 1C shows a bottom view of a carrier of a light-emitting device shown in FIG. 1A.
Figure 1D:
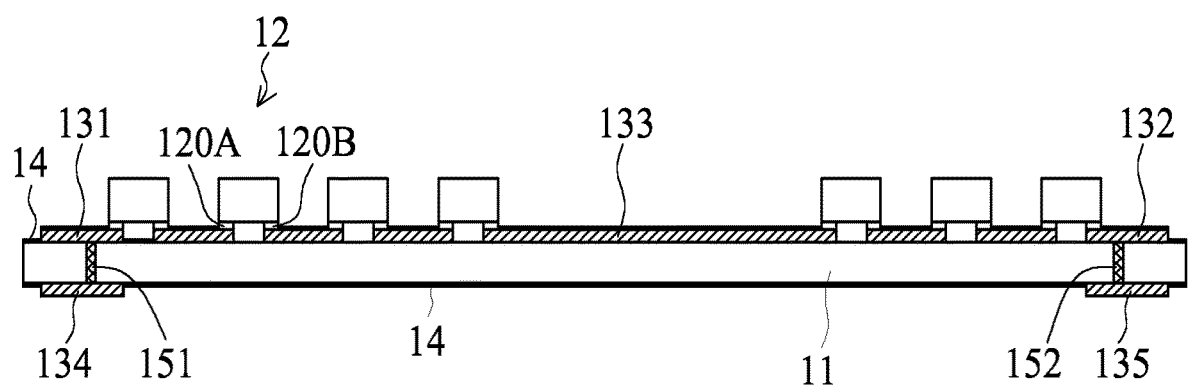
FIG. 1D shows a cross-sectional view taken along line I-I of FIG. 1B of a light-emitting device shown in FIG. 1A.
Figure 1E:
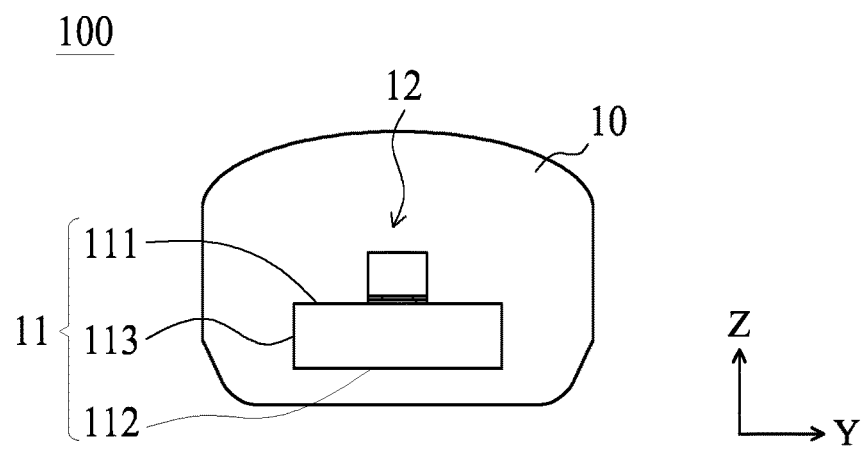
FIG. 1E shows a cross-sectional view of a light-emitting device shown in FIG. 1A.

FIG. 1A shows a drawing of a light-emitting device 100 in accordance with an embodiment of the present disclosure. FIG. 1B shows a top view of a carrier 11 shown in FIG. 1A. FIG. 1C shows a bottom view of a carrier 11 shown in FIG. 1A. FIG. 1D shows a cross-sectional view taken along line I-I of FIG. 1B of a light-emitting device shown in FIG. 1A. FIG. 1E shows a cross-sectional view of FIG. 1A along the YZ direction. Referring to FIGS. 1A~1E, the light-emitting device 100 includes an optic structure 10, a carrier 11, and a plurality of light-emitting units 12. The carrier 11 has a top surface 111 and a bottom surface 112. A circuit structure 13 is formed on the top surface 11 and has a first electrode pad 131, a second electrode pad 132, and a conductive circuit trace 133. The plurality of light-emitting units 12 is disposed on and connected in series by the conductive circuit traces 133 which are on the top surface 111. In other embodiment, the plurality of light-emitting units 12 is connected in parallel, in series-parallel, or in bridging connection by another type of the conductive circuit traces 133. In this embodiment, the light from the plurality of light-emitting units 12 does not pass through the carrier 11. Therefore, the light from the plurality of light-emitting units 12 emits toward the top surface 111 but does not pass through the top surface 111. The carrier 11 can be a circuit board. The core layer of the circuit board includes metal, thermoplastic material, thermosetting material, or ceramic material. The metal includes Al, Cu, Au, Ag, an alloy thereof. Besides, the metal can be a multilayer structure or a single layer structure. The thermosetting material includes phenolic resin, epoxy, bismaleimide triazine resin, or combinations thereof. The thermoplastic material includes polyimide resin, polytetrafluorethylene, and so on. The ceramic material includes aluminum oxide, aluminum nitride, aluminum silicon carbide, and so on.

As shown in FIGS. 1A, 1B, and 1C, a reflective layer 14 is formed on the top surface 111 and the circuit structure 13, and exposes some portions of the conductive circuit traces 133, which are the exposed conductive circuit traces 1331, 1332 right under the plurality of light-emitting units 12 for bonding, and the electrode pads 131, 132. The exposed conductive circuit traces 1331, 1332 are physically separated. In this embodiment, the conductive circuit trace 1332A close to the electrode pad 131 is physically separated from the electrode pad 131 and the conductive circuit trace 1331B close to the electrode pad 132 is physically separated from the electrode pad 132. Each of the light-emitting units 12 has a first connecting pad 120A and a second connecting pad 120B electrically and physically connected to the exposed conductive circuit traces 1331, 1332. In this embodiment, the shape of the top view of each of exposed conductive circuit traces 1331, 1332 is rectangular and has a long side parallel to that of the carrier 11. In another embodiment, the long side of each of exposed conductive circuit traces 1331, 1332 is parallel to the short side of the carrier 11, or has an angle between 0~90 degree with the long side of the carrier 11. In another embodiment, the shape of the top view of the exposed conductive traces 1331, 1332 are a round, an ellipse, or a polygon. Additionally, the reflective layer 14 is able to reflect the light from the light-emitting unit 12 toward the carrier 11 to increase the lighting efficiency of the light-emitting device 100.

As shown in FIG. 1C and FIG. 1D, the light-emitting unit 12 is not disposed on the bottom surface 112. The circuit structure 13 further includes a third electrode pad 134 and a fourth electrode pad 135 formed on the bottom surface 112 of the carrier 11. The positions of the third electrode pad 134 and the forth electrode pad 135 correspond to the position of the first electrode pad 131 and the second electrode pad 132 respectively. A first through-hole 151 passes through the carrier 11 and has a conductive material filled therein partially or entirely for electrically connecting to the first electrode pad 131 and the third electrode pad 134. A second through-hole 152 passes through the carrier 11 and has a conductive material filled therein partially or entirely for electrically connecting to the second electrode pad 132 and the fourth electrode pad 135. In one embodiment, the external power (power supply) can be connected to the first electrode pad 131 and the second electrode pad 132 so as to make the plurality of light-emitting units 12 emit light. In one embodiment, the third electrode pad 134 and the fourth electrode pad 135 are not physically connected to the external power. While the electrode pads 131, 132 are electrically connected to the external power by resistance welding (soldering), a metal clip is needed to clip the carrier 11, and the third electrode pad 134 and the fourth electrode pad 135 can make the light-emitting device 100 more robust and provide a conductive path during the clipping process of the fabrication. In one embodiment, the electrode pads 131, 132 are electrically connected to the external power by bonding wire and the third electrode pad 134 and the fourth electrode pad 135 does not need to be formed.

Figure 1F:
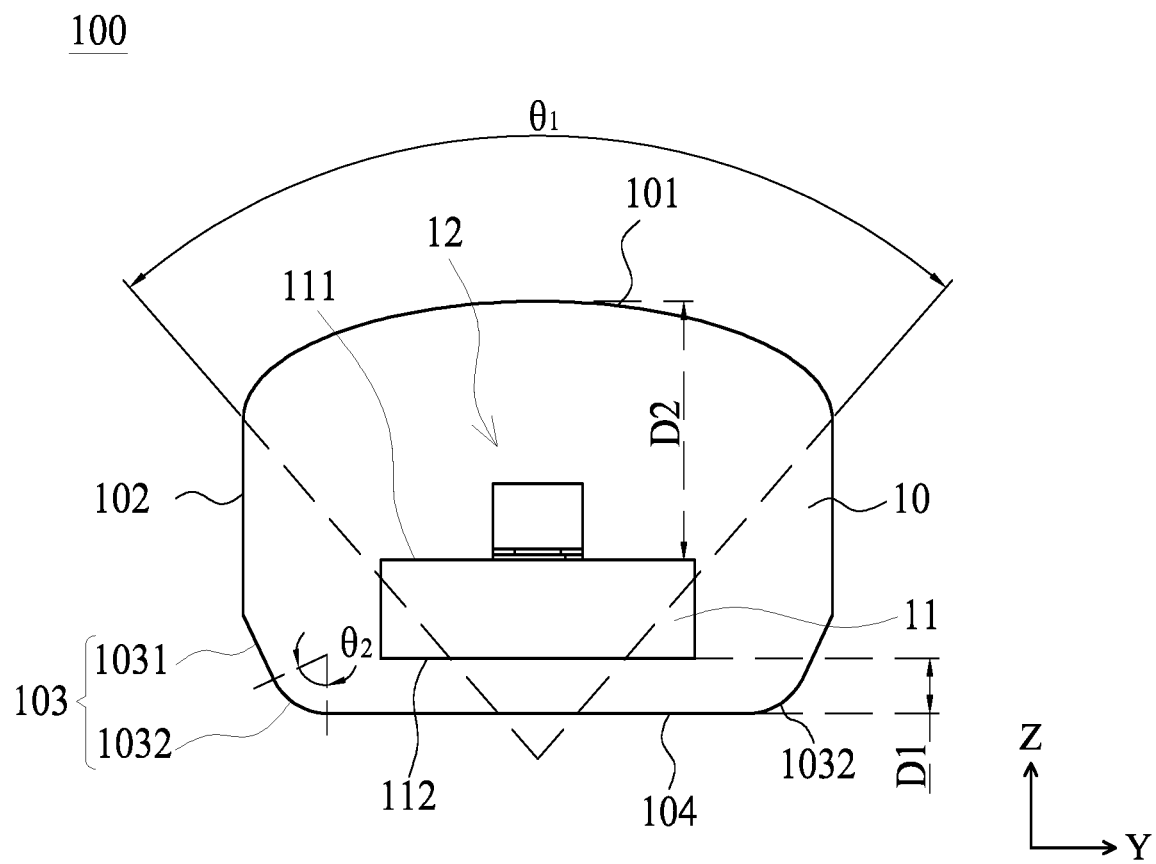
FIG. 1F shows an enlarged view of FIG. 1E.

As shown in FIG. 1A and FIG. 1E, the optic structure 10 covers the top surface 111, the bottom surface 112 of the carrier 11, and the side surface 113 of the two long sides of the carrier 11, and exposes the electrode pads 131, 132, 134, 135. The optic structure 10 has a rectangular-like shape in cross-sectional view. FIG. 1F is an enlarged view of FIG. 1E. The optic structure 10 has a top surface 101 with a curved portion; two side surfaces 102 which are substantial straight lines and parallel to each other in the cross-sectional view; two side-bottom surfaces 103; and a bottom surface 104 which is a substantial flat surface connecting two side-bottom surface 103. The top surface 101 is arranged above the top surface 111 of the carrier 11 and the bottom surface 104 is arranged under the bottom surface 112 of the carrier 11. The side surface 102 extends from the top surface 101 to the bottom surface 112 of the carrier 11 along z direction. Each side-bottom surfaces 103 includes a first portion 1031 which extends from the side surface 102 to the bottom surface 104 with an inclined angle; and a second portion 1302. The second portion 1302 located at right side or left side of the optic structure 10 connects the first portion 1031 and extends curvedly to the bottom surface 104, respectively. The first distance (D1) between the bottom surface 112 of the carrier 11 and the bottom surface 104 of the optic structure 10 is of 0.3 mm~0.7 mm; the second distance (D2) between the top surface 111 of the carrier 11 and the top surface 101 of the optic structure 10 is of 0.8 mm~0.13 mm. The second distance (D2) is larger than the first distance (D1). The top surface 101 has a curved portion with a curvature radius of 0.4 mm~0.7 mm, and has a central angle $\theta_1$ of 40°~60° or a radium of $2\pi/9$~$\pi/3$. The second portion 1302 of the side-bottom surface 103 has a curved portion with a curvature radius of 0.2~0.4 mm, and has a central angle $\theta_2$ of 5°~20° or a radium of $\pi/36$~$\pi/9$. The diffusing powder (TiO$_2$, ZrO$_2$, ZnO, Aluminum oxide) can be optionally filled in the optic structure 10 to improve the diffusion or/and the scatter of the light from the light-emitting unit 12. The diffusing powder in the optic structure 10 has a weight percentage concentration (w/w) of 0.1~0.5%, and has a particle size of 10 nm~100 nm or 10~50 μm. In one embodiment, the weight percentage concentration of the diffusing powder in the gel can be measured by the thermogravimetric analyzer (TGA). In brief, during the heating process, the temperature is increased gradually and the gel can be removed by evaporation of thermal cracking reaction, for example, while the temperature reaches a certain degree so the diffusing powder is remained. Hence, the weight of the gel and the weight of the diffusing powder can be obtained based on the weight difference of the measuring object, and the weight percentage concentration of the diffusing powder in the gel is determined. Alternatively, the total weight of the gel and the diffusing powder can be measured first, and when the gel is removed by the solvent afterward, the weight of the diffusing powder is measured and the weight percentage concentration of the diffusing powder in the gel is obtained. Referring to FIG. 1A, although the plurality of light-emitting units 12 can be seen, the optic structure 10 would look like white when the concentration of the diffusing powder filled in the optic structure reaches a specific level so the plurality of light-emitting units 12 cannot be seen.

The optic structure 10 is transparent to light, such as sunlight or the light from the light-emitting unit 12. The optic structure 10 includes silicone, epoxy, PI, BCB, PFCB, SU8, acrylic resin, PMMA, PET, PC, polyetherimide, fluorocarbon polymer, Al$_2$O$_3$, SINR, or SOG.

Figure 2A:
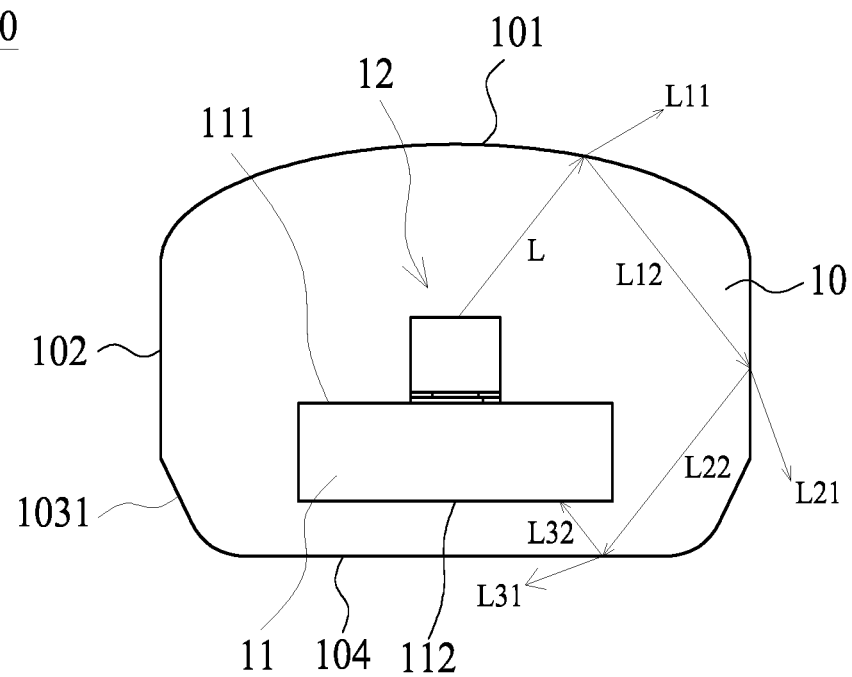
FIGS. 2A~2D respectively show different light emitting routes of the light-emitting unit within the optic structure.
Figure 2B:
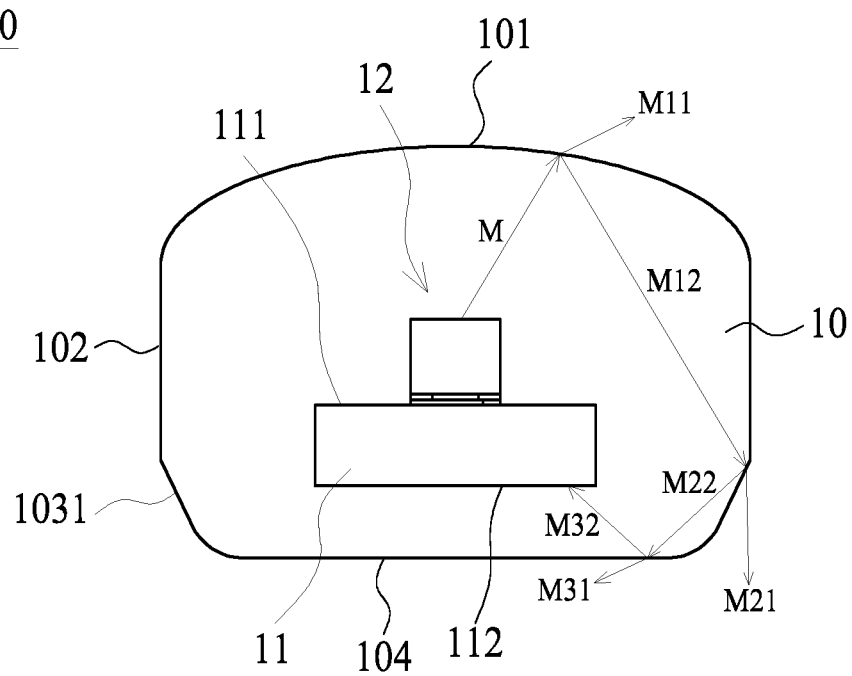
Figure 2C:
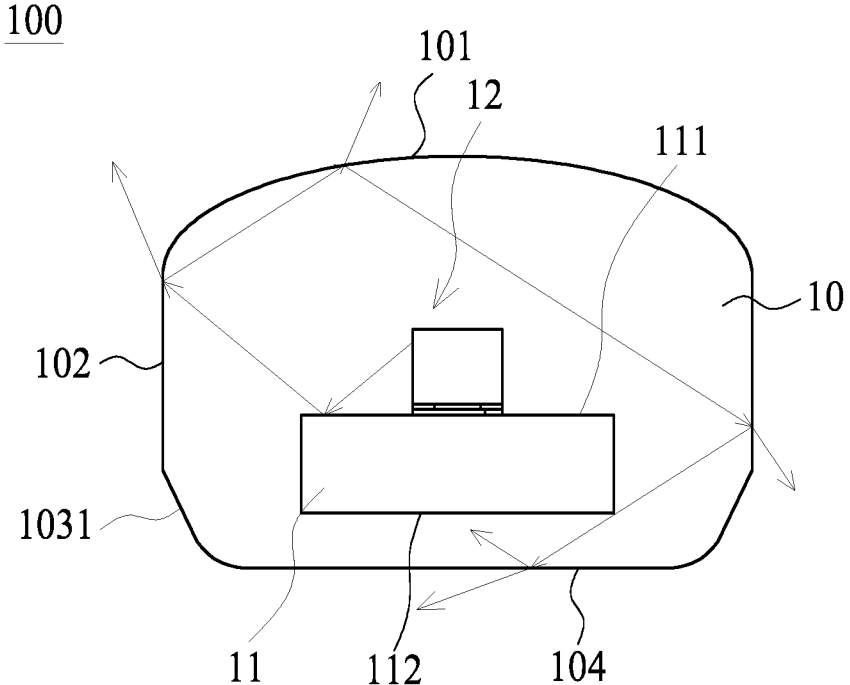
Figure 2D:
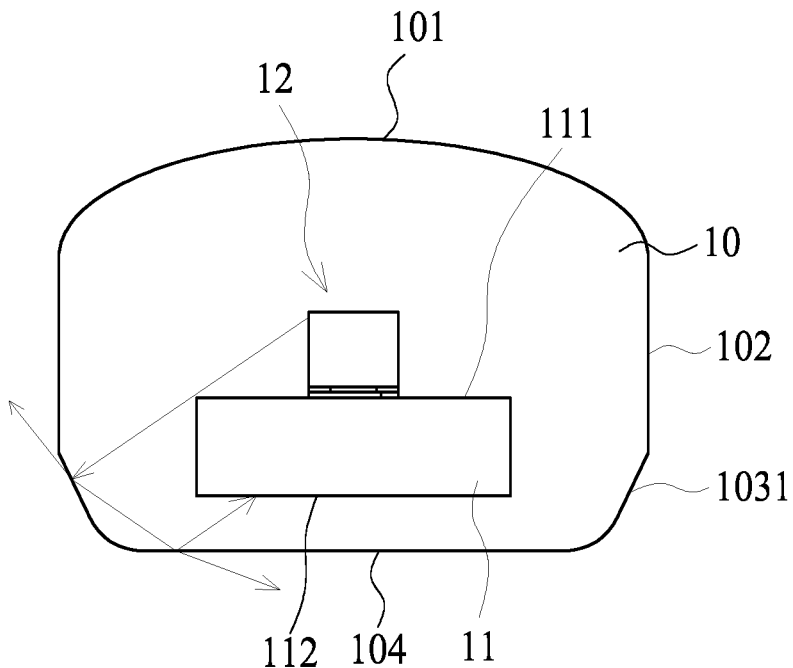

FIG. 2A shows a light emitting route of the light-emitting unit 12 within the optic structure 10. To be more specific, the route shown in the figure is just one of several possible routes and not a unique route. The following figures are similar to FIG. 2A. For example, the light (L) from the light-emitting unit 12 emits to the top surface 101 and produces a first refracting light (L11) and a first reflecting light (L12) on the top surface 101. The first reflecting light (L12) emits to the side surface 102 and produces a second refracting light (L21) and a second reflecting light (L22) on the side surface 102. The second reflecting light (L22) emits to the bottom surface 104 and produces a third refracting light (L31) and a third reflecting light (L32) on the bottom surface 104. Or, as shown in FIG. 2B, for example, the light (M) from the light-emitting unit 12 emits to the top surface 101 and produces a first refracting light (M11) and a first reflecting light (M12) on the top surface 101. The first reflecting light (M12) emits to the first portion 1031 of the side-bottom surface 103 and produces a second refracting light (M21) and a second reflecting light (L22) on the first portion 1031. The second reflecting light (M22) emits to the bottom surface 104 and produces a third refracting light (M31) and a third reflecting light (M32) on the bottom surface 104. FIG. 2C and FIG. 2D show other possible light emitting routes within the optic structure 10. The probability of the light emitting out of the bottom surface 112 of the carrier 10 and out of the bottom surface 104 can be increased by the geometric design of the optic structure 10 according to the present disclosure. The light-emitting device 100 can have a first luminous intensity above the top surface 111 (the first side) and a second luminous intensity under the bottom surface 112 (the second side), and the ratio of the first luminous intensity to the second luminous intensity is about of 2~9. The definition of the first luminous intensity and the second luminous intensity can refer to the following description. To be more specific, the light emitting route shown in the figure is just one of the several possible routes and is not the only route. Though the light is refracted and reflected on a surface simultaneously, the light can also be refracted only or reflected only depending on the difference of the refractive index between the materials, the incident angle, and the wavelength of light at the boundary of materials, etc.

Figure 2E:
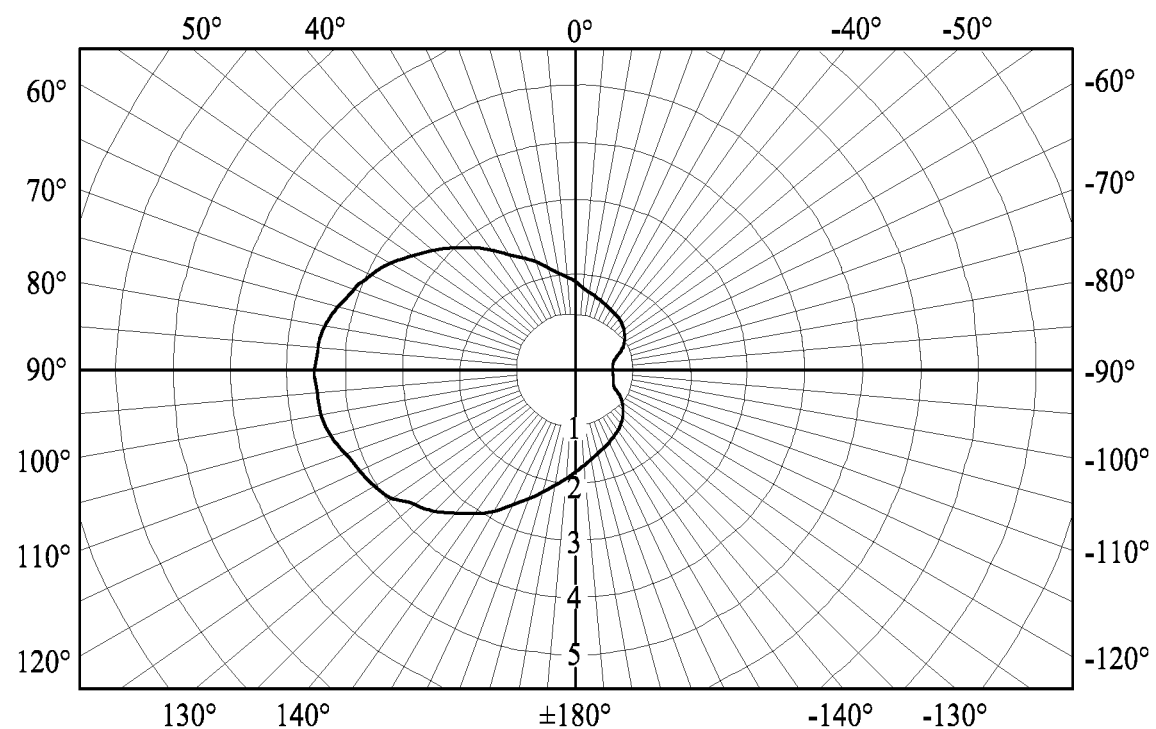
FIG. 2E shows a luminous intensity distribution curve of a light-emitting device in accordance with an embodiment of the present disclosure.

FIG. 2E shows a luminous intensity distribution curve of a light-emitting device 100 operated under an operating current of 10 mA and in a thermal steady state. In more detail, when the light-emitting device 100 emits light, an imaginary circle (as the P1 circle shown in FIG. 1A) of the light intensity is measured by the luminous intensity distribution measuring system. Furthermore, the light intensity of each point on the circle and corresponding angle are plotted to obtain the luminous intensity distribution curve. For measuring purpose, the light-emitting device 100 has a geometric center at a position corresponding to the center of the P1 circle. In this embodiment, the weight percentage concentration of the diffusing powder is 0.3%. As shown in the figure, the maximum of the light intensity is about 4.53 candela (cd); the light intensity from 0° to 180° is substantially a lambertian distribution. To be more specific, the light intensity is minimum at −90° and is about 0.5 candela (cd); the light intensity is almost the same from −90° to −80°; the light intensity from −80° to 90° is gradually increased; the curve in the light intensity from −90°~0°~90° is similar to that from 90°~180°~−90°; and the light intensity distribution within a range of angle of −90°~0°~90° is symmetrical to that within a range of angle of 90°~180°~−90° with respect to the axis of 90°~−90°. Furthermore, in the luminous intensity distribution curve, the overall of the light intensity within a range of angle of 0°~90°~180° is the first light intensity, and the overall of the light intensity within a range of angle of 0°~−90°~−180° is the second light intensity, the ratio of the first light intensity to the second light intensity is about 4. The emitting angle of the light-emitting device 100 calculated from the luminous intensity distribution curve is about 160°.

The emitting angle is defined as the angular range from the maximum light intensity down to 50% of the maximum light intensity. For example, a relationship curve (not shown) between light intensity and angle is drawn using a Cartesian coordinate system (x coordinate represents angle; y coordinate represents light intensity) transformed from the luminous intensity distribution curve (polar diagram) obtained by measuring the P1 circle of the light-emitting device 100 of FIG. 2E. Next, a line is plotted whereat the value is 2.265 candela (50% of the maximum light intensity) parallel to the x coordinate to intersect the curve at two points (two intersections) and an angular range between the two points is calculated to obtain the emitting angle.

Figure 3A:
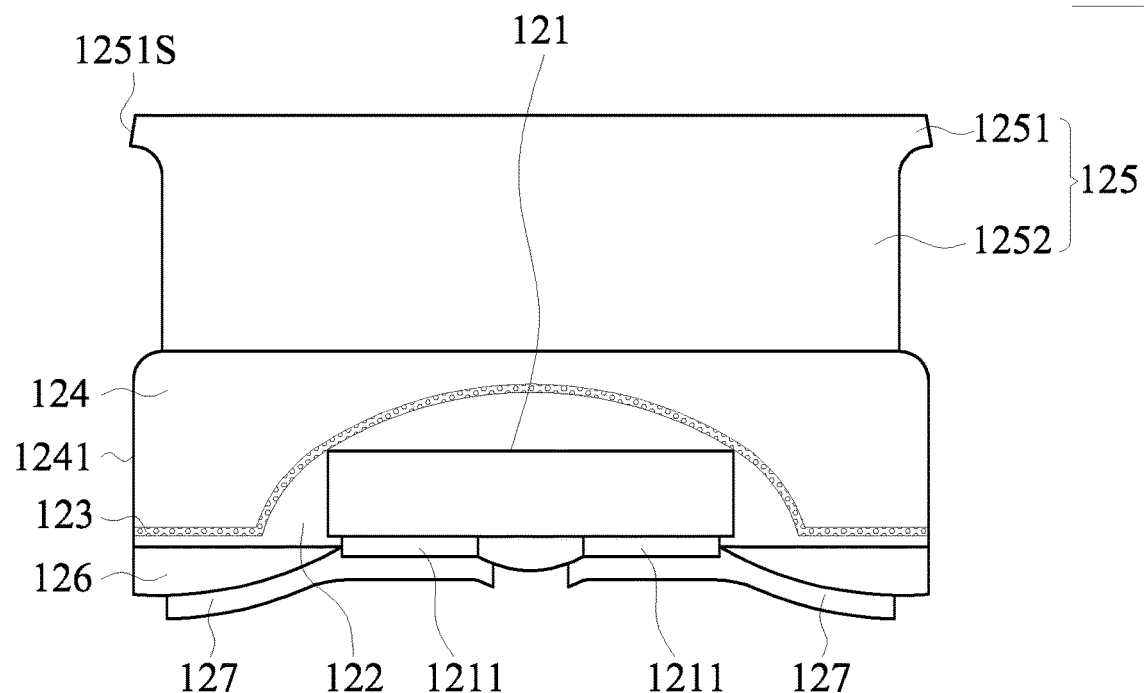
FIG. 3A shows a cross-sectional view of a light-emitting unit in accordance with an embodiment of the present disclosure.

FIG. 3A shows a cross-sectional view of the light-emitting unit 12A in accordance with an embodiment of the present disclosure. The light-emitting unit 12A includes a light-emitting body 121, a first transparent element 122, a phosphor structure 123, a second transparent element 124, and a third transparent element 125. The light-emitting body 121 includes a substrate, a first-type semiconductor layer, an active layer, a second-type semiconductor layer (above is not shown), and two electrodes 1211. When the light-emitting body 121 has a hetero-structure, the first-type semiconductor layer and the second-type semiconductor layer, for example a cladding layer or a confinement layer, provide holes and electrons, respectively, and each type layer has a bandgap greater than that of the active layer, thereby improving probability of electrons and holes combining in the active layer to emit light. The first-type semiconductor layer, the active layer, and the second-type semiconductor layer include a semiconductor material of III-V group, such as $Al_xIn_yGa_{(1-x-y)}N$ or $Al_xIn_yGa_{(1-x-y)}P$ with $0 \leq x,y \leq 1$, $(x+y) \leq 1$. According to the material of the active layer, the light-emitting body 121 can emit a red light having a peak wavelength or dominant wavelength between 610~650 nm, a green light having a peak wavelength or dominant wavelength between 530~570 nm, or a blue light having a peak wavelength or dominant wavelength between 450~490 nm. The phosphor structure 123 includes a plurality of phosphor particles. The phosphor particle has a particle size of 5 μm~100 μm (diameter) and includes one or more than two kinds of phosphor material. The phosphor material includes, but is not limited to, yellow-greenish phosphor and red phosphor. The yellow-greenish phosphor includes aluminum oxide (such as YAG or TAG), silicate, vanadate, alkaline-earth metal selenide, or metal nitride. The red phosphor includes fluoride ($K_2TiF_6$:$Mn^{4+}$, $K_2SiF_6$:$Mn^{4+}$), silicate, vanadate, alkaline-earth metal sulfide, oxynitride, or a mixture of tungstate and molybdate. The phosphor structure 123 can absorb a first light from the light-emitting body 121 to convert to a second light with a peak wavelength different from that of the first light. The first light is mixed with the second light to produce a mixing light, such as white light. In an embodiment, the light-emitting unit 12 has a white color temperature of 2200K~6500K (ex. 2200K, 2400K, 2700K, 3000K, 5700K, 6500K) and a color point (CIE x, y) is within a seven-step MacAdam ellipse, and has a color rendering index (CRI) greater than 80 or 90. In another embodiment, the first light can be mixed with the second light to produce a purple light, yellow light or other non-white light.

The light-emitting unit 12 further includes an insulting layer 126 formed under the first transparent element 122, the phosphor structure 123, and the second transparent element 124 without covering two electrodes 1211 of the light-emitting body 121; and two extending electrodes 127 are formed on the electrodes 1211 and electrically connected to the two electrodes 1211. Two extending electrodes 127 are the first connecting pad 120A and the second connecting pad 120B aforementioned (as shown in FIG. 1D). The insulating layer 126 includes a mixture including a matrix and a high reflective material. The matrix includes silicone-based matrix or epoxy-based matrix. The high reflective material includes titanium oxide, silicon dioxide, or aluminum oxide. Furthermore, the insulating layer 126 has a function of reflecting the light or diffusing the light. The extending electrodes 127 can be a single layer or a multilayer structure, and include metal, such as Cu, Ti, Au, Ni, Ag, or alloy thereof. The first transparent element 122, the second transparent element 124, and the third transparent element 125 are transparent to light, such as sunlight or the light from the light-emitting unit 12. The first transparent element 122 and the second transparent element 124 include silicone, epoxy, PI, BCB, PFCB, SU8, acrylic resin, PMMA, PET, PC, polyetherimide, fluorocarbon polymer, $Al_2O_3$, SINR, or SOG. The third transparent element 125 includes sapphire, diamond, glass, epoxy, quartz, acrylic resin, $SiO_x$, $Al_2O_3$, ZnO, or silicone.

As shown in FIG. 3A, the third transparent element 125 has a tapered shape. In more detail, the third transparent element 125 has a first portion 1251 and a second portion 1252. The second portion 1252 is closer to the second transparent element 124 than the first portion 1251 and has a width smaller than that of the first portion 1251. The first portion 1251 has a thickness 1%~20% or 1%~10% of the thickness of the third transparent element 125. In this embodiment, an intersection where the first portion 1251 meets with the second portion 1252 is as an arc. The first portion 1251 has a side surface 1251S slightly inclined to upward (face upward), and is more far away from the side surface of the light light-emitting body 121 than the side surface 1241 of the second transparent element 124 to guide the light to two sides of the light-emitting unit 12.

In an embodiment, the light-emitting unit 12A is defined as a five-surface (top, left, right, front, and rear) light-emitting structure and has an emitting angle (beam angle) of about 140°. Alternatively, the diffusing powder can be added in the first transparent element 122, and/or the second transparent element 124, and/or the third transparent element 125. In another embodiment, the light-emitting unit 12A does not include the third transparent element 125.

Figure 3B:
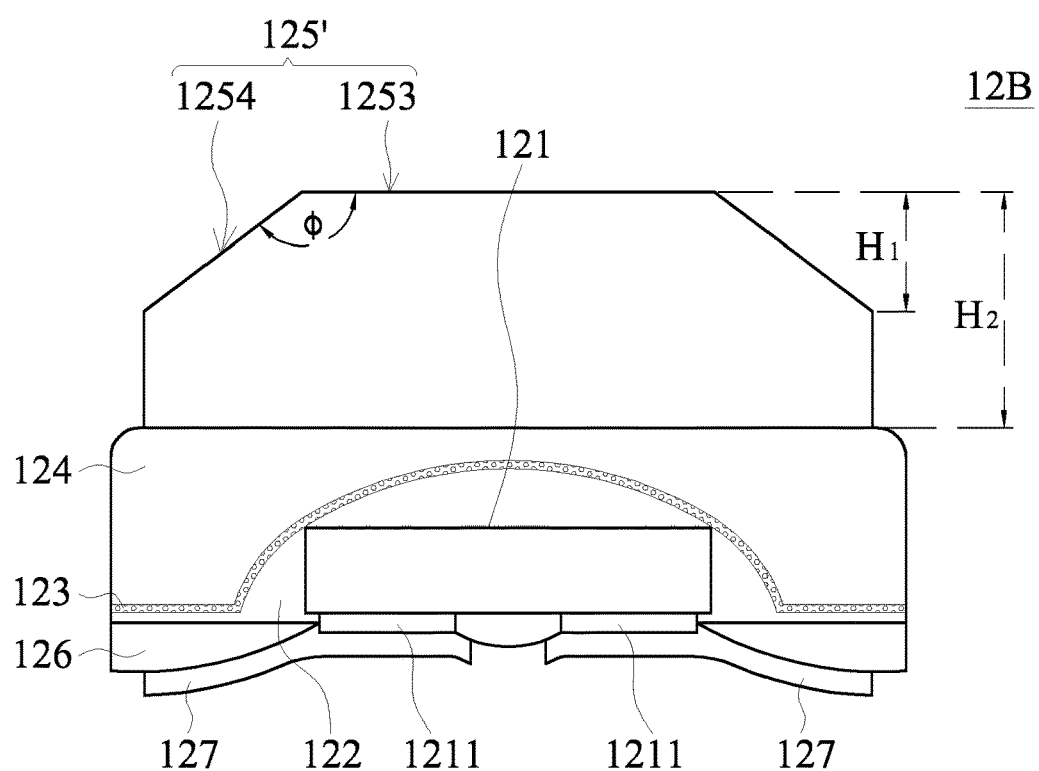
FIG. 3B shows a cross-sectional view of a light-emitting unit in accordance with another embodiment of the present disclosure.
Figure 3C:
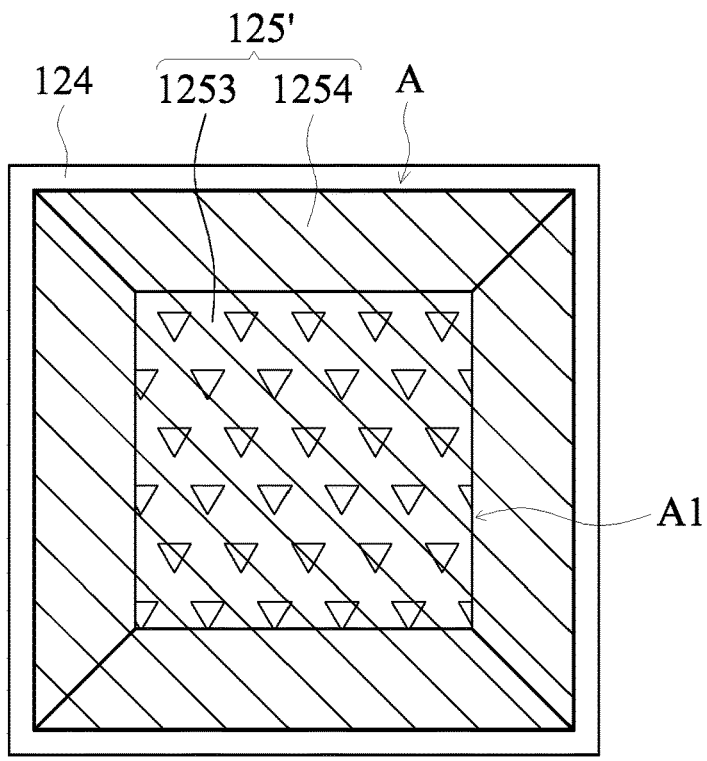
FIG. 3C shows a top view of FIG. 3B.

FIG. 3B shows a cross-sectional view of the light-emitting unit 12B in accordance with another embodiment of the present disclosure. FIG. 3C is a top view of FIG. 3B. The light-emitting unit of FIG. 3B has a structure similar to that of FIG. 3A, wherein devices or elements with similar or the same symbols represent those with the same or similar functions. As shown in FIG. 3B, the third transparent element 125' has a shape of frustum with a surface 1253 and an inclined surface 1254. The inclined surface 1254 can increase the lighting extraction of the light-emitting body 121 and change the light field of the light-emitting unit 12. The surface 1253 and the inclined surface 1254 have an angle (Φ) between 120°~150°, and the thickness ($H_1$) of the inclined surface 1254 is 30%~70% or 40%~60% of the thickness ($H_2$) of the third transparent element 125'. As shown in FIG. 3C, the area of the projecting plane of the surface 1253 (A1; triangle) is 40%~95% or 40%~60% of that (A; inclined line) of the third transparent element 125.

Figure 3D:
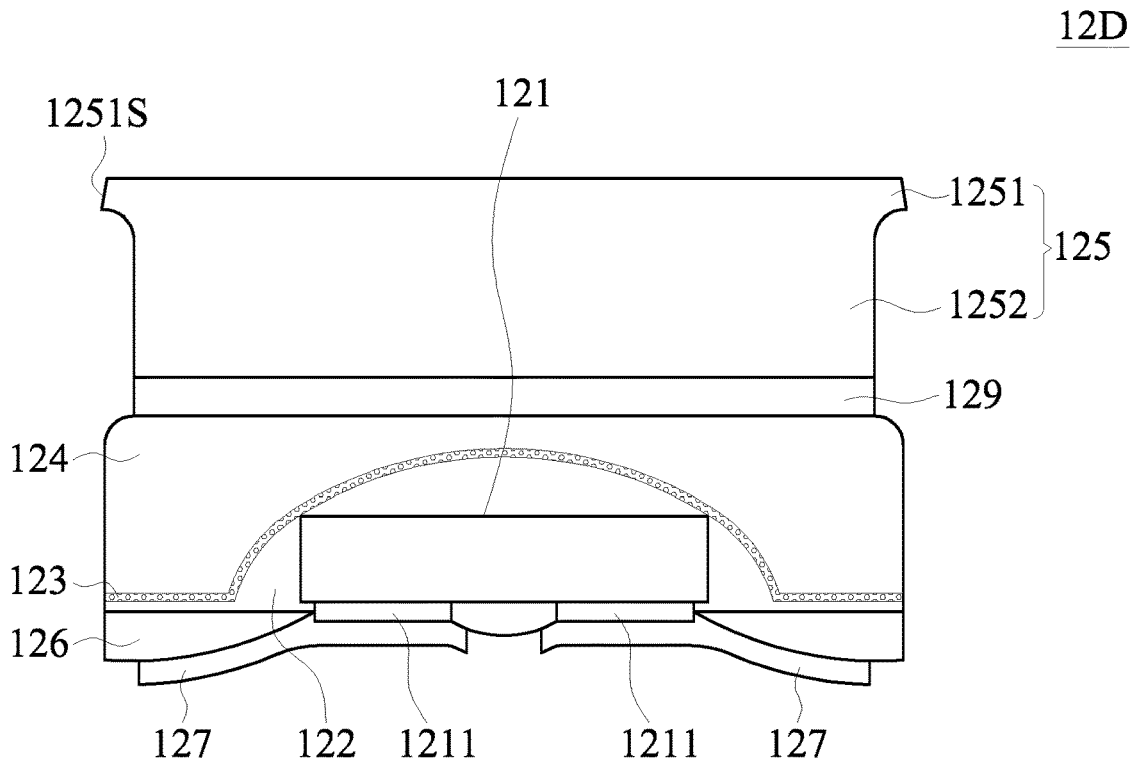
FIG. 3D shows a cross-sectional view of a light-emitting unit in accordance with another embodiment of the present disclosure.

FIG. 3D shows a cross-sectional view of the light-emitting unit 12D in accordance with another embodiment of the present disclosure. The light-emitting unit of FIG. 3D has a structure similar to that of FIG. 3A, wherein devices or elements with similar or the same symbols represent those with the same or similar functions. Light-emitting unit 12D further includes a reflective structure 129 formed between the first transparent element 124 and the second transparent element 125. The reflective structure 129 has a reflectivity larger than 85% when the incident light has a peak wavelength between 450 nm and 475 nm; or the reflective structure 129 has a reflectivity larger than 80% when the incident light has a peak wavelength between 400 nm and 600 nm. The light not reflected by the reflective structure 129 emits into the third transparent element 125. If the reflective structure 129 reflects most of the light, for example, when the reflectivity is more than 95%, the light-emitting unit 12D can leave out the third transparent element 125. The reflective structure 129 can be a single layer structure or a multiple layers structure. The single layer structure can be a metal layer or an oxide layer. The metal layer includes sliver and aluminum, and the oxide layer includes titanium dioxide. The multiple layers structure can be a stack structure of metal and metal oxide or a Distributed Bragg Reflector (DBR). The stack structure of metal and metal oxide can be the stack of aluminum and aluminium oxide. The DBR can be the semiconductor layer or non-semiconductor layer. The non-semiconductor layer is made of a material chosen from the following: $Al_2O_3$, $SiO_2$, $TiO_2$, $Nb_2O_5$, or $SiN_x$. The semiconductor layer is made of a material chosen from the following: GaN, AlGaN, AlInGaN, AlAs, AlGaAs, and GaAs. In this embodiment, both the single layer structure and the multiple layers structure do not reflect all amount of the light, hence at least a portion of the light passes through the reflective structure 129.

In another embodiment, the light-emitting unit 12 shown in FIG. 1A has a structure similar to the light-emitting unit 12A, 12B, or 12D shown in FIG. 3A, FIG. 3B, FIG. 3D, but without including the phosphor structure 123. Therefore, the light-emitting unit 12 emits the original light from the light-emitting body 121, such as red, green, or blue. The plurality of phosphor particles (wavelength converting materials) is added in the optic structure 10 to absorb the first light from the light-emitting body 121 and convert to the second light which is different from the first light. Hence, the light-emitting device 100 has a white color temperature of 2200K~6500K (ex. 2200K, 2400K, 2700K, 3000K, 5700K, 6500K) and a color point (CIE x, y) is within a seven-step MacAdam ellipse, and has a color rendering index (CRI) greater than 80 or 90.

The light-emitting unit is disposed on the carrier by the flip chip bonding in this embodiment. In another embodiment, the plurality of light-emitting units with horizontal type or vertical type (not shown) is fixed on the carrier by the silver paste or the conductive transparent paste; then, the plurality of light-emitting units is electrically connected by wire boding; finally, providing an optic structure to cover the plurality of light-emitting units to form the light-emitting device.

Figure 4:
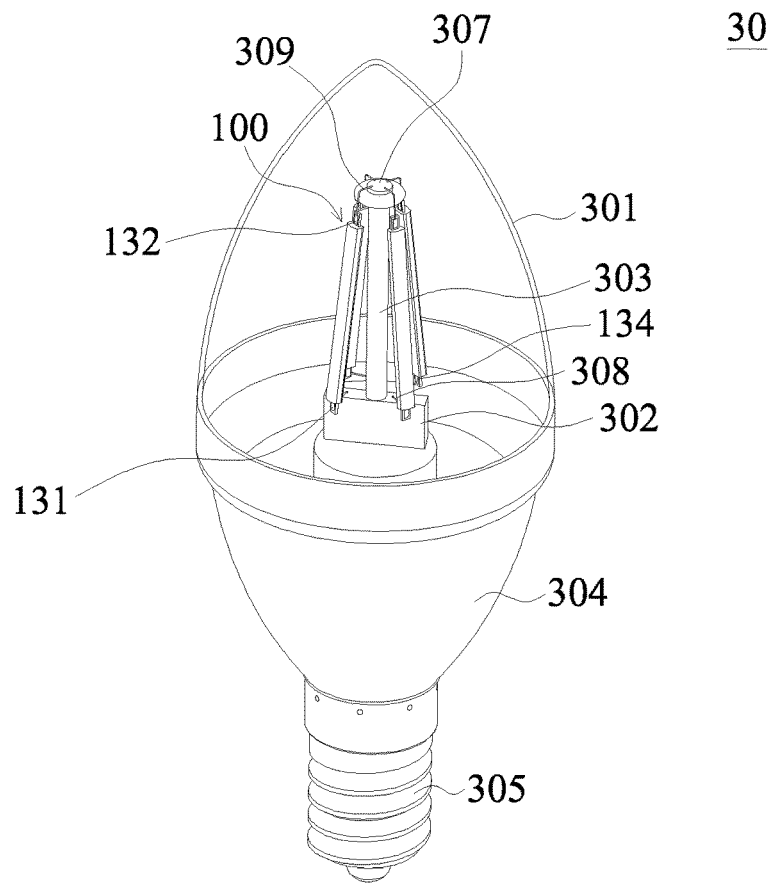
FIG. 4 shows a drawing of a lamp in accordance with an embodiment of the present disclosure.

FIG. 4 shows a drawing of a lamp 30 in accordance with an embodiment of the present disclosure. The lamp 30 includes a cover 301, a circuit board 302, a supporting post 303, a plurality of the light-emitting devices 100, a thermal dissipating structure 304, and an electrical connector 305. The plurality of light-emitting devices 100 is fixed and electrically connected to the supporting post 303. In more detail, an electrode 307 is formed on the supporting post 303 and electrically connected to the circuit board 302. The third electrode pad 134 of each of the light-emitting device 100 electrically connects the circuit board 302 by a metal wire 308. Because the first electrode pad 131 is electrically connected to the third electrode pad 134, the first electrode pad 131 also electrically connects the circuit board 302. The second electrode pad 132 of each of the light-emitting device 100 electrically connects the electrode 307 by a metal wire 309. In this embodiment, according to the electrical connecting way of the foresaid, the plurality of light-emitting devices 100 is connected in parallel. In another embodiment, the plurality of light-emitting devices 100 is connected in series or in series-parallel.

Figure 5A:
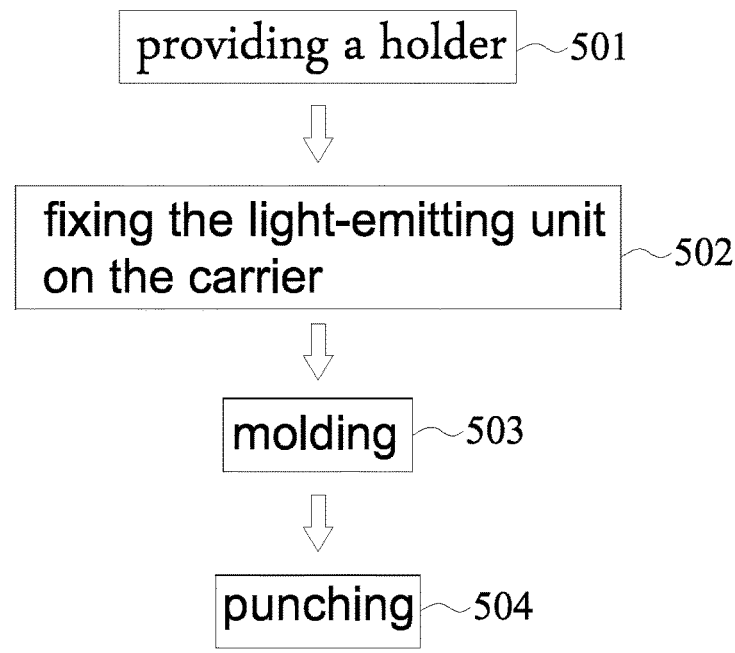
FIG. 5A shows a manufacturing flow of a light-emitting device in accordance with an embodiment of the present disclosure.
Figure 5B:
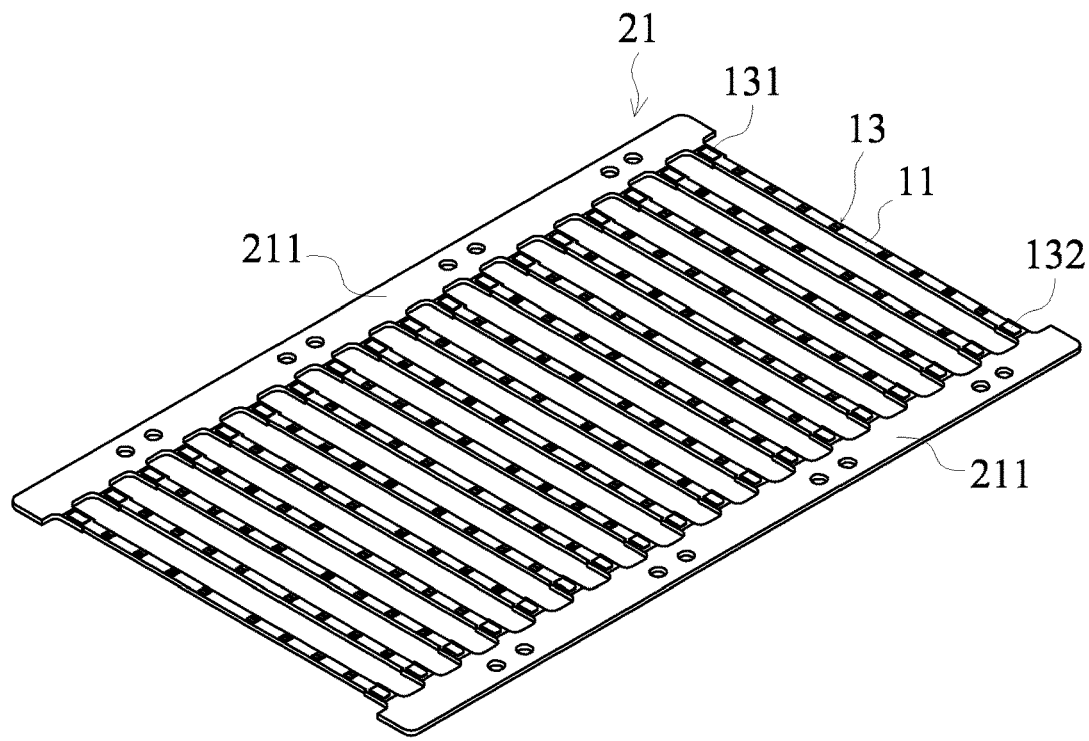
FIGS. 5B~5E show drawings of manufacturing a light-emitting device in accordance with an embodiment of the present disclosure.
Figure 5C:
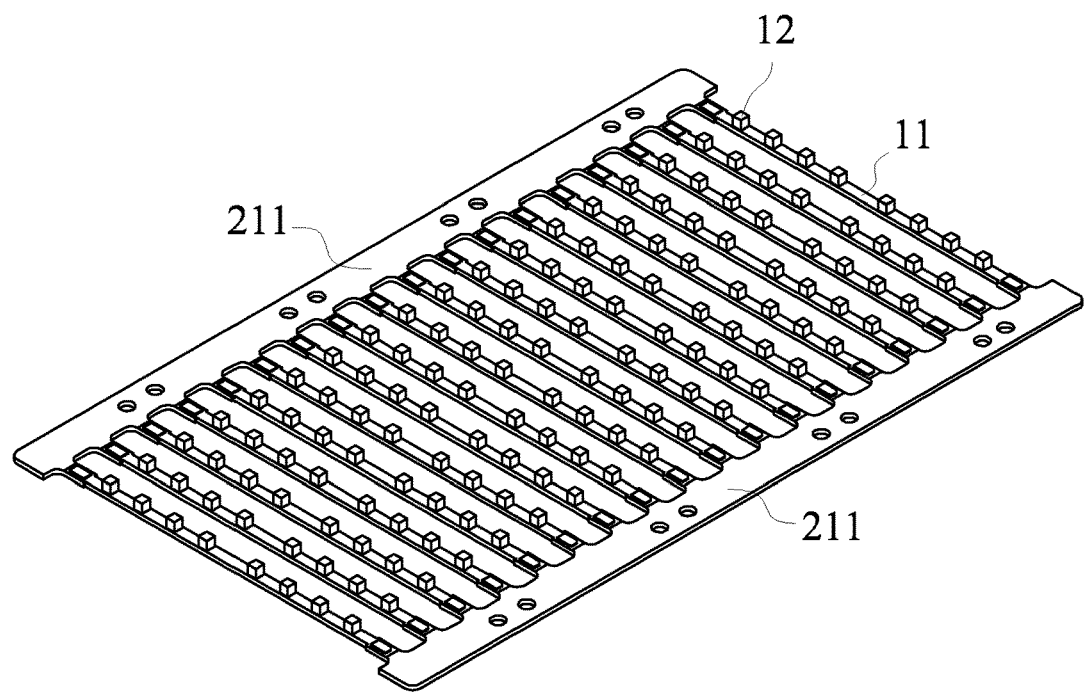
Figure 5D:
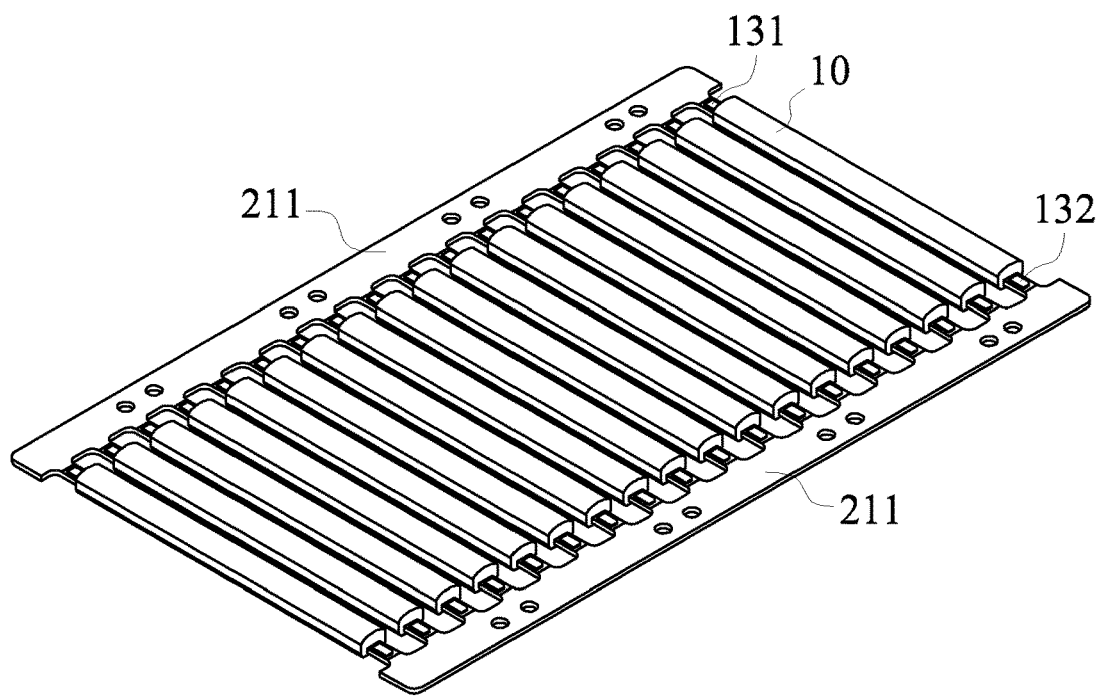
Figure 5E:
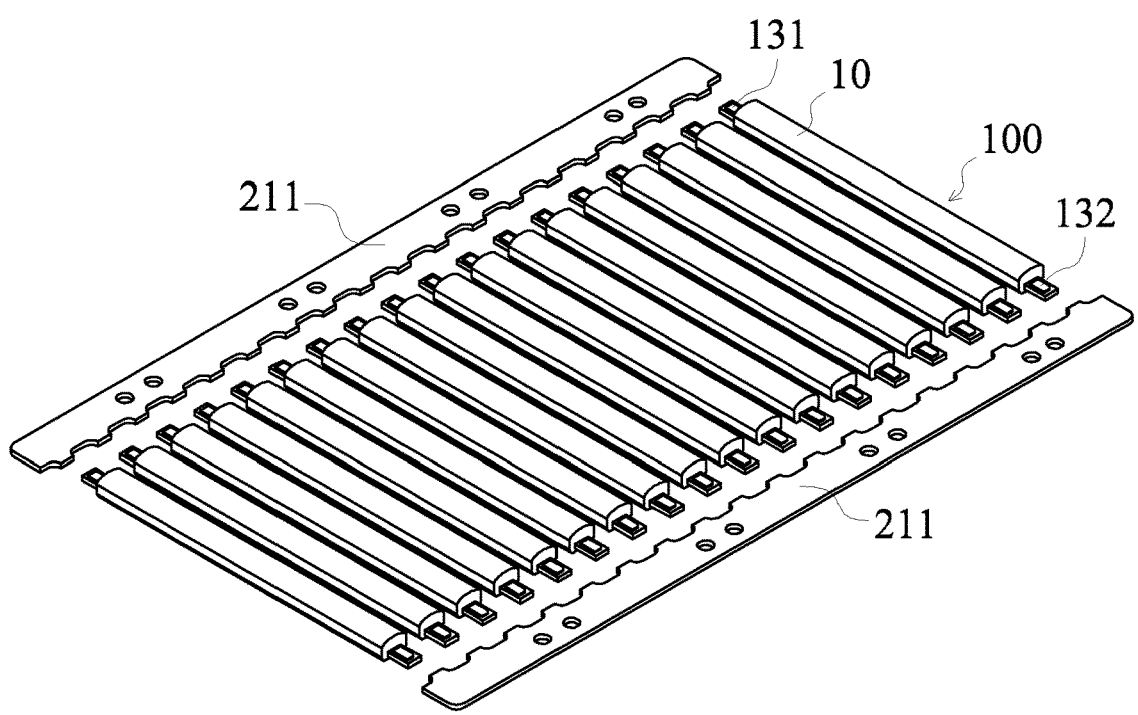

FIG. 5A shows a manufacturing flow of a light-emitting device in accordance with an embodiment of the present disclosure. As shown in FIG. 5A and FIG. 5B, a holder 21 is provided in step 501. The holder 21 includes two frames 211 and a plurality of carriers 11, and the plurality of carriers 11 is arranged between and connected to two frames 211. The carrier 11 has a circuit structure 13 which is formed before or after forming two frames 211 and the carrier 11. For example, two frames 211 and the carrier 11 are formed by stamping a unity board, and the circuit structure 13 can be formed first on that unity board before stamping or on the carrier 11 after the stamping step. As shown in FIG. 5A and FIG. 5C, the plurality of light-emitting units 12 is fixed on the carrier 11 by surface mount technology (SMT) in the step 502, and the plurality of light-emitting units 12 is electrically connected each other by the circuit structure 13. As shown in FIG. 5A and FIG. 5D, the optic structure 10 is formed in the step 503 by molding, such as injection molding or transfer molding. The light-emitting units 12 and the carrier 11 are enclosed by the optic structure 10 and the electrodes 131, 132 are exposed out of the optic structure 10. As shown in FIG. 5A and FIG. 5E, the carrier 11 and two frames 211 are separated in the step 504 by punching or laser cutting, hence each independent light-emitting device 100 can be obtained at the same time or in one step.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A lamp, comprising:
    a first carrier comprising a first portion and a second portion extended from the first portion;
    an electrode pad disposed on the first portion;
    a plurality of light-emitting units disposed on the second portion;
    a conductive line electrically connecting the electrode pad and at least one of the plurality of light-emitting units;
    a first reflective layer contacting the conductive line without covering the plurality of light-emitting units;
    an optic structure comprising a wavelength converting material, and contacting the plurality of light-emitting units without covering the first portion; and
    a cover covering the first portion and the second portion, wherein the first portion is wider than the second portion in a top view.

2. The lamp according to claim 1, wherein the first carrier comprises a third portion extended from the second portion and exposed from the optic structure.

3. The lamp according to claim 1, wherein the optic structure covers the conductive line.

4. The lamp according to claim 1, further comprising a second carrier which is not parallel to the first carrier.

5. The lamp according to claim 4, wherein each of the first carrier and the second carrier has a rear surface on which the plurality of light-emitting units is not disposed.

6. The lamp according to claim 5, wherein the cover has a geometric center in a top view, the rear surfaces of the first carrier and the second carrier are arranged to face the geometric center.

7. The lamp according to claim 4, further comprising a supporter inclined with the first carrier and the second carrier.

8. The lamp according to claim 1, wherein the first carrier has a top surface on which the plurality of light-emitting units is disposed and a rear surface opposite to the top surface, a first light intensity measured above the top surface, and a second light intensity measured under the rear surface, a ratio of the first light intensity to the second light intensity is in a range of 2 to 9.

9. The lamp according to claim 1, wherein the first carrier includes a metallic material.

10. The lamp according to claim 1, wherein the first carrier includes a ceramic material.

11. The lamp according to claim 1, wherein the plurality of light-emitting units is connected in series-parallel.

12. The lamp according to claim 1, wherein each of the plurality of light-emitting unit has a light-emitting body and a reflective structure arranged in a configuration of reflecting light from the light-emitting body.

13. The lamp according to claim 12, wherein each of the plurality of light-emitting units has a plurality of electrodes, the plurality of electrodes and the reflective structure are disposed on opposite sides of the light-emitting body.

14. The lamp according to claim 12, further comprising a transparent element disposed on the reflective structure.

15. The lamp according to claim 1, further comprising a second reflective layer, wherein the plurality of light-emitting units and the second reflective layer are disposed on opposite surfaces of the first carrier.

* * * * *